US012805317B2

(12) United States Patent
Martin et al.

(10) Patent No.: US 12,805,317 B2
(45) Date of Patent: Nov. 17, 2026

(54) DIAMOND-METAL COMPOSITE HIGH POWER DEVICE PACKAGES

(71) Applicant: MACOM Technology Solutions Holdings, Inc., Lowell, MA (US)

(72) Inventors: Quinn Don Martin, Morrisville, NC (US); Walter Nagy, Raleigh, NC (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 17/661,418

(22) Filed: Apr. 29, 2022

(65) Prior Publication Data

US 2023/0352360 A1 Nov. 2, 2023

(51) Int. Cl.

| | |
|---|---|
| ***H10W 40/25*** | (2026.01) |
| ***H10W 76/01*** | (2026.01) |
| ***H10W 76/157*** | (2026.01) |
| ***H10W 99/00*** | (2026.01) |

(52) U.S. Cl.

CPC ......... *H10W 40/254* (2026.01); *H10W 76/01* (2026.01); *H10W 76/157* (2026.01); *H10W 99/00* (2026.01)

(58) Field of Classification Search

None

See application file for complete search history.

(56) References Cited

U.S. PATENT DOCUMENTS

| | | |
|---|---|---|
| 5,019,892 A | 5/1991 | Grabbe |
| 5,109,268 A | 4/1992 | Butera |
| 5,185,653 A | 2/1993 | Switky et al. |

(Continued)

FOREIGN PATENT DOCUMENTS

| | | |
|---|---|---|
| CN | 102195596 A | 9/2011 |
| CN | 102522376 A | 6/2012 |

(Continued)

OTHER PUBLICATIONS

International Search Report and Written Opinion in PCT/US2023/064625, mailed Jun. 21, 2023.

(Continued)

*Primary Examiner* — Benjamin P Sandvik

(74) *Attorney, Agent, or Firm* — Perilla Knox & Hildebrandt LLP; Jason M. Perilla

(57) ABSTRACT

Semiconductor device packages and methods of manufacture are described. In one example, a semiconductor device package includes a flange, a frame secured to a major surface of the flange, with the frame forming an air cavity bounded in part by a surface of the flange, and at least one conductive lead that extends from outside the frame, through a portion of the frame, and is exposed within the air cavity for wire bonding. Other packages without air cavities are also described. The flange can incorporate a composite core material including diamond particles distributed in metal. The flange offers improved thermal conductivity, for greater heat dissipation from and additional performance of semiconductor devices within the packages. The flange exhibits thermal conductivity greater than that of Copper and other materials. The flange also exhibits a coefficient of thermal expansion suitable for bonding semiconductor die including GaN and SiC materials to the flange.

22 Claims, 13 Drawing Sheets

(56) References Cited

U.S. PATENT DOCUMENTS 6,002,173 A * 12/1999 Casati ................. H01L 23/4334
257/796
6,011,303 A 1/2000 Tanaka et al.
6,114,048 A 9/2000 Jech et al.
6,171,691 B1 1/2001 Nishibayashi
6,198,163 B1 3/2001 Crowley et al.
6,211,436 B1 4/2001 Kossmann et al.
6,211,463 B1 4/2001 Fabis
6,335,863 B1 1/2002 Yamamoto et al.
6,396,130 B1 5/2002 Crowley et al.
6,421,244 B1 7/2002 Shinohara et al.
6,703,692 B1 3/2004 Pruitt
6,727,117 B1 * 4/2004 McCoy ............... H10W 40/254
257/746
6,774,465 B2 8/2004 Lee et al.
6,914,330 B2 7/2005 Kneringer et al.
6,921,971 B2 7/2005 Basho et al.
6,979,843 B2 12/2005 Nakajima et al.
6,983,537 B2 1/2006 Park
6,987,318 B2 1/2006 Sung
7,224,047 B2 5/2007 Carberry et al.
7,791,188 B2 9/2010 Sung
7,923,739 B2 4/2011 Hussell
8,178,893 B2 5/2012 Takashima et al.
8,531,026 B2 9/2013 Sung
8,907,473 B2 12/2014 Crowder et al.
9,117,793 B2 8/2015 Wityak et al.
9,572,291 B2 2/2017 Minamio et al.
9,831,143 B2 11/2017 Martin
10,211,113 B2 2/2019 Martin
10,553,519 B2 2/2020 Morikawa et al.
10,600,718 B1 * 3/2020 Ozard ................. H01L 29/7787
2003/0153128 A1 8/2003 Ito
2004/0011699 A1 1/2004 Park
2004/0183172 A1 9/2004 Saito et al.
2004/0262720 A1 12/2004 Satou et al.
2005/0051891 A1 3/2005 Yoshida et al.
2008/0144291 A1 6/2008 Hu et al.
2009/0051018 A1 2/2009 Moline
2010/0319900 A1 * 12/2010 Abyzov .............. H01L 23/3732
204/192.15
2012/0164792 A1 6/2012 Rotay
2012/0276403 A1 * 11/2012 Nakagawa .......... H01L 23/3735
205/50
2014/0001624 A1 * 1/2014 Wityak ............... H01L 23/3733
257/690
2014/0159098 A1 6/2014 Chen et al.
2014/0182824 A1 7/2014 Hirotsuru et al.
2014/0248725 A1 9/2014 Lin et al.
2017/0062295 A1 * 3/2017 Martin .................... H01L 23/66
2017/0287810 A1 * 10/2017 Morikawa ........... H01L 23/3735
2017/0323837 A1 * 11/2017 Koba ...................... H01L 23/04
2019/0074235 A1 * 3/2019 Zou ..................... H01L 23/3677
2019/0355656 A1 * 11/2019 Hayashi .................. H01L 23/40
2021/0002769 A1 * 1/2021 Goto ....................... C23C 18/50
2021/0175150 A1 * 6/2021 Ichinohe ........... H01L 23/49503
2022/0216124 A1 7/2022 He et al.
2023/0126268 A1 4/2023 Matsugi et al.

FOREIGN PATENT DOCUMENTS

CN 102709256 A 10/2012
CN 103681379 A 3/2014
JP H09213826 A 8/1997
JP H10144852 A 5/1998
JP H10163393 A 6/1998
JP 2004146413 A 5/2004
JP 2005026294 A 1/2005
JP 2006041550 A 2/2006
JP 2006222259 A 8/2006
JP 2007201376 A 8/2007
JP 2018111883 A 7/2018
JP 2018527762 A 9/2018
JP 2021158349 A 10/2021
JP 6980161 B1 11/2021
WO 1997005757 A1 2/1997

OTHER PUBLICATIONS

Office Action for Japanese Application No. 2024-563937 mailed Jul. 2, 2026. (machine translation).

* cited by examiner

DIAMOND-METAL COMPOSITE HIGH POWER DEVICE PACKAGES

BACKGROUND

Various types of packages are available for electrical components, such as active and passive semiconductor devices, resistors, capacitors, and inductors, among others. The packages can both protect and secure the components and provide electrically conductive leads to make one or more electrical contacts with the components. Such packages can be surface mounted, through-hole mounted, or inserted into printed circuit boards, among other techniques. The type, size, lead style, structure, materials, and other characteristics of a package can be selected based on the type of components being housed within them, as well as the application for the components. For example, certain packages can be more or less suitable for components used in high power and high frequency applications.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figure 1A:
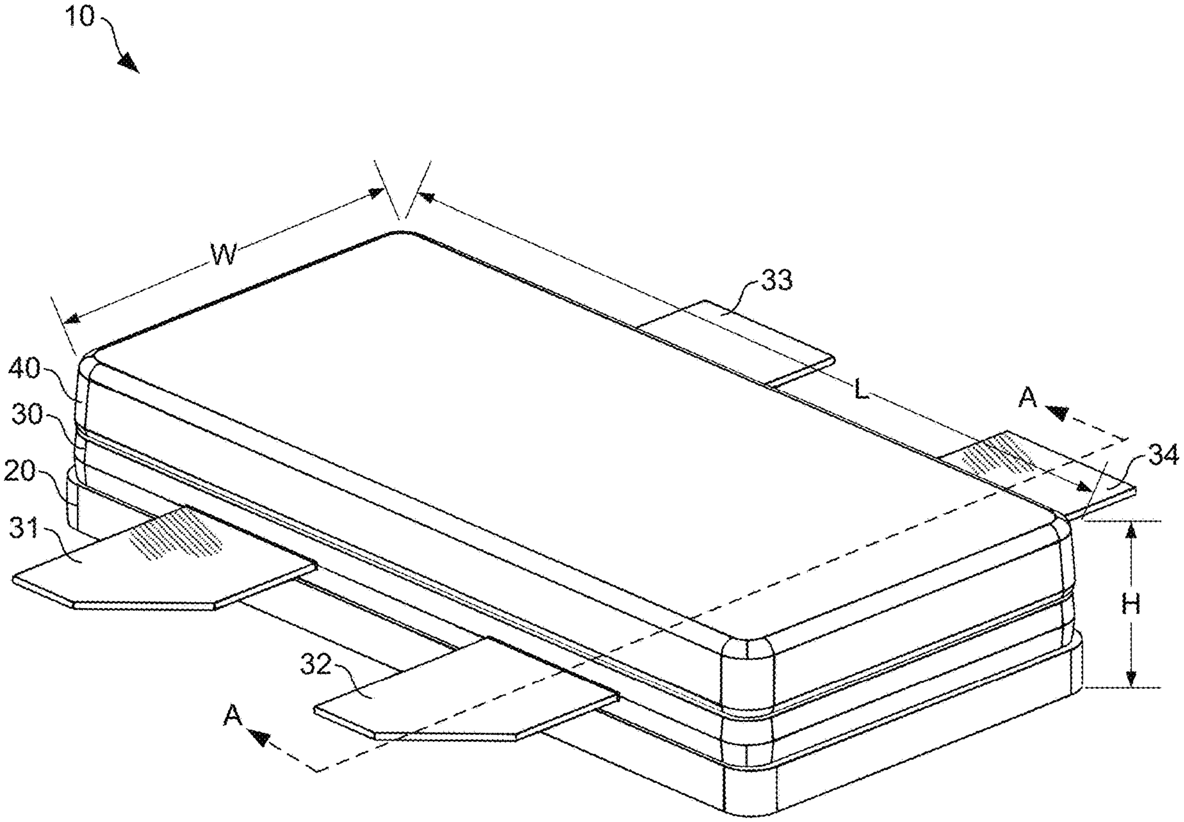
FIG. 1A illustrates a perspective view of a semiconductor device package according to various embodiments described herein.

A number of different packages are available for electrical components, including devices formed on semiconductor die. The packages can both protect and secure the components and provide electrically conductive leads to make one or more electrical contacts with the components. As examples, flat no-leads packages such as quad-flat no-leads (QFN) packages can be used to physically secure and electrically connect semiconductor devices and integrated circuits to printed circuit boards (PCBs). Flat no-leads packages are one of several types of packages that can be used to connect devices to PCBs without through holes. Packages including an air cavity are also used for semiconductor devices used for high power and frequency applications, because dielectric capacitances can be minimized, among other benefits. Air cavity packages can include leads and be mounted on PCBs, in through holes of PCBs, and in other configurations. Some packages are more suitable for components used in high power and high frequency applications, and the type, size, lead style, structure, materials, and other characteristics of packages can be selected and designed based on the types of components being housed within them, as well as the application for the components.

Among others, sufficient thermal dissipation is an important characteristic of high power radio frequency (RF) packages, particularly for packaging devices formed on Gallium Nitride (GaN), Silicon Carbide (SiC), and other high power density semiconductor materials. High power semiconductor die have been directly attached to package flanges or slugs made of metals. One fundamental problem with metal flanges has been the tradeoff between the thermal conductivity (TC) and the coefficient of thermal expansion (CTE) of the flanges. Typically, a higher TC for a flange material has been accompanied by a higher CTE, making the flange less compatible with the CTEs of GaN, SiC, and similar semiconductor materials.

Diamond is a unique material because it has a high TC and a low CTE. According to aspects of the embodiments, diamonds or diamond particles are incorporated into the flanges and slugs of high power RF packages. Composite materials for flanges according to the embodiments include diamonds or diamond particles and other metals, such as Silver (Ag), among others. These core materials can be tailored by modifying the diamond-to-metal ratio, diamond particle size, type of metal, total thickness, and plating metal layers above and/or below the diamond-metal core composite, to meet the needs of certain applications. The materials can be tailored for targeted TC, CTE, flatness, or roughness, producing surfaces compatible with certain die attach materials or joining processes.

A diamond composite flange is only one component of a functional RF package. Frames and conductive leads are also incorporated with the diamond composite flanges according to the embodiments, to form internal air cavities within the packages. Both pre-formed and molded frames can be used. Pre-formed window frames with conductive leads can be attached to flanges with plastic adhesives, as one example. The pre-formed frames can be sourced in different lead configurations for flexibility. Securing pre-formed frames to flanges using plastic adhesives is also a low temperature process, which can protect the diamond composite material of the flanges.

In the context outlined above, the embodiments described herein are directed to semiconductor device packages and methods of manufacture of such packages. In one example, a semiconductor device package includes a flange, a frame secured to a top surface of the flange, with the frame forming an air cavity bounded in part by the top surface of the flange, and at least one conductive lead that extends from outside the frame, through a portion of the frame, and is exposed within the air cavity for wire bonding. The flange incorporates a composite core material including diamond particles distributed in metal. The flange exhibits thermal conductivity greater than that of Copper (Cu), Aluminum Nitride (AlN), Copper Molybdenum (CuMo), Copper Tungsten (CuW), laminates of CuMo and/or CuW, and other materials. The flange also exhibits a coefficient of thermal expansion suitable for bonding semiconductor die including Gallium Nitride (GaN) and Silicon Carbide (SiC) materials to the flange.

In other examples, a leadframe and packages formed using the leadframe are described. Using the leadframe, several packages can be formed at one time. Further, electrical components can be placed within the packages by repositioning several devices at a time using the leadframe. After assembly, the packages can be separated from the leadframe. The packages can include a flange or slug incorporating the diamond composite materials described herein, a plastic frame that surrounds the flange and forms an air cavity, and a cover that encloses the air cavity. The package further includes one or more conductive leads of the leadframe that extend through the plastic frame and are exposed within the air cavity. The conductive leads can be relied upon to bond out components secured within the air cavity. Finally, a cover can be secured to enclose the air cavity.

Figure 1B:
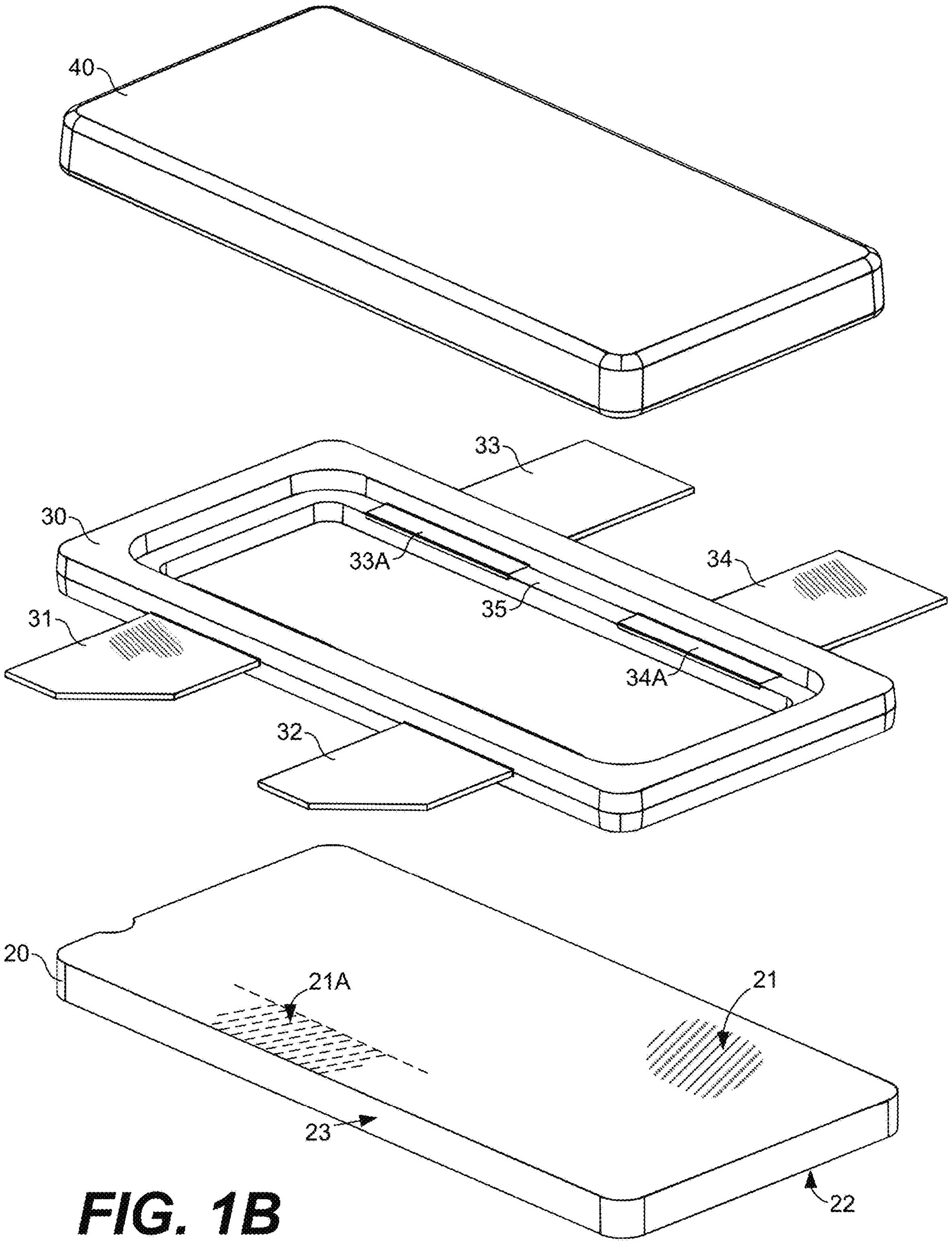
FIG. 1B illustrates an exploded view of the semiconductor device package shown in FIG. 1A according to various embodiments described herein.
Figure 1C:
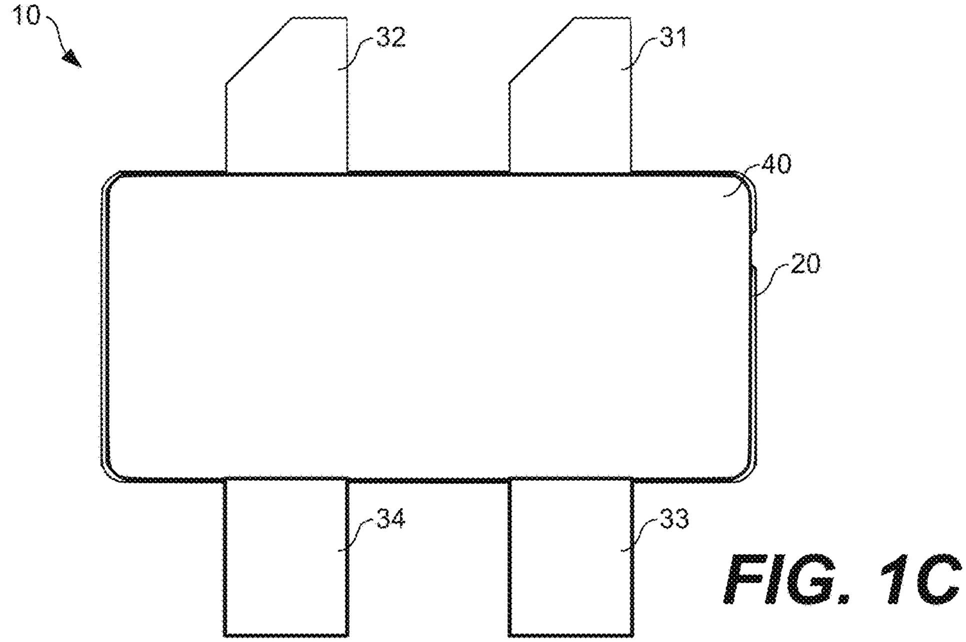
FIG. 1C illustrates a top view of the semiconductor device package shown in FIG. 1A according to various embodiments described herein.

Turning to the drawings, FIG. 1A illustrates a perspective view of an example semiconductor device package 10, FIG. 1B illustrates an exploded perspective view of the package 10 shown in FIG. 1A, and FIG. 1C illustrates a top view of the package 10 shown in FIG. 1A. The package 10 is illustrated as a representative example to convey the concepts of the embodiments described herein. The package 10 is not drawn to scale, and other packages consistent with the concepts described herein can vary in shape and/or size as compared to that shown. For example, the length "L," width "W," and height "H" of the package 10 can vary among embodiments. Similarly, as described below, the size, number, and positions of the conductive leads of the package 10 can vary. The aspects of the embodiments are also not limited to any particular package type, size, lead style, or structure.

Referring among FIGS. 1A-1C, the package 10 includes a flange 20, a frame 30 secured to a major surface of the flange 20, and a cover 40 secured over the frame 30. An air cavity is formed within the package 10, bounded by the top surface of the flange 20, an opening within the frame 30, and the cover 40. A number of semiconductors devices, formed on semiconductor die, can be secured within the package 10, as described below with reference to FIG. 3. Because components within the air cavity are not surrounded by (i.e., in contact with) package molding materials, they are not subject to electrical effects due to the materials (e.g., parasitic capacitances, etc.).

The package 10 also includes a number of conductive leads 31-34, each of which extends from outside the frame 30, through at least a portion of the frame 30, and is exposed in part within the air cavity inside the package 10. The semiconductor devices in the package 10 can be electrically coupled, using wire bonds or other means, to the exposed portions of the conductive leads 31-34 within the package 10, as described in additional detail below. The conductive leads 31-34 can be formed from Cu, Al, Tin (Sn), Ag, Au, Zinc (Zn), other metals, or any compositions thereof, and can be plated with Ag, Au, Ni, Pd, or other metals using full plating, spot-plating or other techniques.

The flange 20 can also serve as a conductive lead of the package 10, as the flange 20 is electrically conductive in some embodiments. Thus, a semiconductor device die including a transistor source metal layer on the bottom of the die can be electrically coupled to the flange 20. The flange 20 can act as a source contact or lead for the package 10 in that case. In other cases, the flange 20 can act as a heat sink but not an electrical contact, as described below.

The package 10 is designed with an aim to increase the thermal conductivity and heat dissipation from semiconductor devices packaged within the package 10. In one aspect, the flange 20 includes materials that exhibit high TC for dissipating heat more effectively than other types of materials. The materials of the flange 20 also exhibit CTE values matched for the reliable attachment of semiconductor die to the flange 20, without a large enough mismatch between the CTEs of the flange 20 and the die to result in mechanical separation under heating cycles. In one case, the materials in the flange 20 can be selected, based in part, so that the CTE of the flange 20 is matched to the CTE of a SiC substrate to the degree necessary for reliable attachment. In other cases, the materials in the flange 20 can be tailored to have a CTE matched to other substrate materials.

As described in further detail below, the flange 20 is embodied using a composite core material having a higher thermal conductivity than materials commonly used for flanges and heat slugs in semiconductor packages. The flange 20 can include a composite core material of diamond particles distributed in a metal or metal alloy. The diamond particles provide a high TC, as natural diamond has a TC of about 2200 W/m·K, whereas Cu has a TC of about 398 W/m·K. Enriched monocrystalline synthetic diamond has been shown to have an even higher TC than natural diamond, and the flange 20 can incorporate synthetic diamond particles. Various sizes and shapes of diamond particles can be used in the composite materials of the flange 20, to tailor the TC of the flange 20, the CTE of the flange 20, or other characteristics.

The diamond particles are mixed and distributed into a metal, such as Silver (Ag), Cu, Mo, or other suitable metals. The metal can also be selected to tailor the TC of the flange 20, the CTE of the flange 20, or other characteristics. In some cases, the diamond particles are mixed and distributed relatively evenly throughout the composite core material, although larger diamond particles can be used in some cases and placed at certain locations within the metal of the composite core material. The metal provides electrical conductivity for the flange 20, and the flange 20 can be relied upon as a conductive terminal of the package 10.

Referring to FIG. 1B, the flange 20, frame 30, and cover 40 are illustrated separately from each other, to show individual features of each. The flange 20 includes a top surface 21, a bottom surface 22, and a peripheral edge surface 23. The top surface 21 and the bottom surface 22 are the two largest (e.g., major) surfaces of the flange 20. Additional details related to the flange 20, the materials of the flange 20, and other flanges and slugs exhibiting high thermal conductivity are described in additional detail below with reference to FIG. 5.

The frame 30 is formed to have a ring or frame shape, with a central opening, as shown in FIG. 1A. In one example, the frame 30 can be formed by molding plastic or polymers, such as liquid crystal polymers (LCPs) or polymer blends, with or without glass, carbon, or other reinforcements, among other materials. The frame 30 can be formed using materials selected to provide protection (e.g., protection against temperatures, vibration, moisture, and other conditions) for the components in the package 10, mechanical strength, matching of the thermal expansion as compared to other materials in the package 10, and other relevant factors. In other examples, the frame 30 can be formed using ceramic materials. In that case, the frame 30 can be formed from a ceramic material, and the cover 40 can be formed as a ceramic, metal, or glass lid. The cover 40 can be secured over the frame 30 using any suitable methods to create a hermetic (or near hermetic) seal for the package 10.

The frame 30 includes a central opening or aperture, which encircles the air cavity that is formed between the top surface 21 of the flange 20, the inner periphery of the frame 30, and the underside of the cover 40 in the package 10. The flange 20 and the frame 30 are secured together to create a seal between them. The bottom surface of the frame 30 can be secured to the top surface 21 of the flange 20 using an adhesive, such as epoxy or another plastic adhesive, using mechanical interlocks or interferences, using fasteners, or combinations thereof. In other cases, the bottom surface of the frame 30 can be secured to the top surface 21 of the flange 20 by brazing or soldering.

The bottom surface of the frame 30 can cover a periphery 21A of the top surface 21 of the flange 20. A portion of the periphery 21A is identified in FIG. 2. In some cases, the periphery 21A of the top surface 21 of the flange 20 can be prepared for adhesion with the bottom surface of the frame 30. For example, the top surface 21 of the flange 20 can be smooth and uniform in some cases as manufactured. Thus, the periphery 21A can be roughened using laser etching, mechanical abrasion (e.g., masked or unmasked sandblasting or abrasing), chemical etching, or other techniques in some cases. In other cases, the periphery 21A can be prepared by selective plating to add roughness. The preparation of the periphery 21A in this way can help to strengthen the adhesion or bond between the bottom surface of the frame 30 and the periphery 21A of the flange 20.

The frame 30 includes a raised platform 35 that extends around the central opening and periphery of the frame 30. As noted above, the frame 30 also includes the conductive leads 31-34, which are secured in place by the molded material of the frame 30. The conductive leads 31-34 can include apertures or openings (not shown) in the portions of the conductive leads 31-34 that are surrounded by the molded material of the frame 30. The molded material of the frame 30 can flow through the apertures during manufacture of the frame 30, to help hold the conductive leads 31-34 in place.

The conductive leads 31-34 extend from outside the frame 30, through at least a portion of the frame 30, and into the central opening of the frame 30. Portions of the conductive leads 31-34 are exposed at the level of the raised platform 35. Exposed portions 33A and 34A of the conductive leads 33 and 34 are shown in FIG. 1A, and similar portions of the conductive leads 31 and 32 are exposed at the level of the raised platform 35 on the other side of the frame 30 (see FIG. 3). The frame 30 can include other numbers of conductive leads. For example, the frame 30 can include two conductive leads, one on each side, or more than two conductive leads on each side, as also described below.

A number of semiconductor die, including transistors, capacitor banks, and other circuit elements, can be attached and secured to the top surface 21 of the flange 20. Certain semiconductor die can be electrically coupled to the flange 20 itself. For example, a semiconductor device die including a transistor source metal layer on the bottom of the die can be electrically coupled to the flange 20. The flange 20 can act as a source contact or lead for the package 10 in that case. The semiconductor die can also be electrically coupled to the conductive leads 31-34 of the frame 30, such as to the conductive portions 33A and 34A of the conductive leads 33 and 34, using wire bonds or other means. Examples of semiconductor die in the package 10 are described below with reference to FIG. 3.

The cover 40 can be formed from plastic or other materials similar to that of the frame 30. In other cases, the cover 40 can be formed using ceramic, glass, metal, or other materials. After the frame 30 is secured to the flange 20, the cover 40 can be secured to the frame 30. The bottom surface of the cover 40 can be secured to the top of the frame 30 using adhesives, such as epoxy or other plastic adhesives, plastic welding, heating, or melting processes, using mechanical interlocks or interferences, using fasteners, or combinations thereof. The materials used for the cover 40 can also be selected provide protection against vibrations, moisture, and other conditions for the components in the package 10, mechanical strength, adequate matching of the thermal expansion as compared to other materials in the package 10, and other relevant factors. In some cases, the cover 40 can be hermetically sealed to the frame 30, and the package 10 can be a hermetically sealed package.

Figure 2:
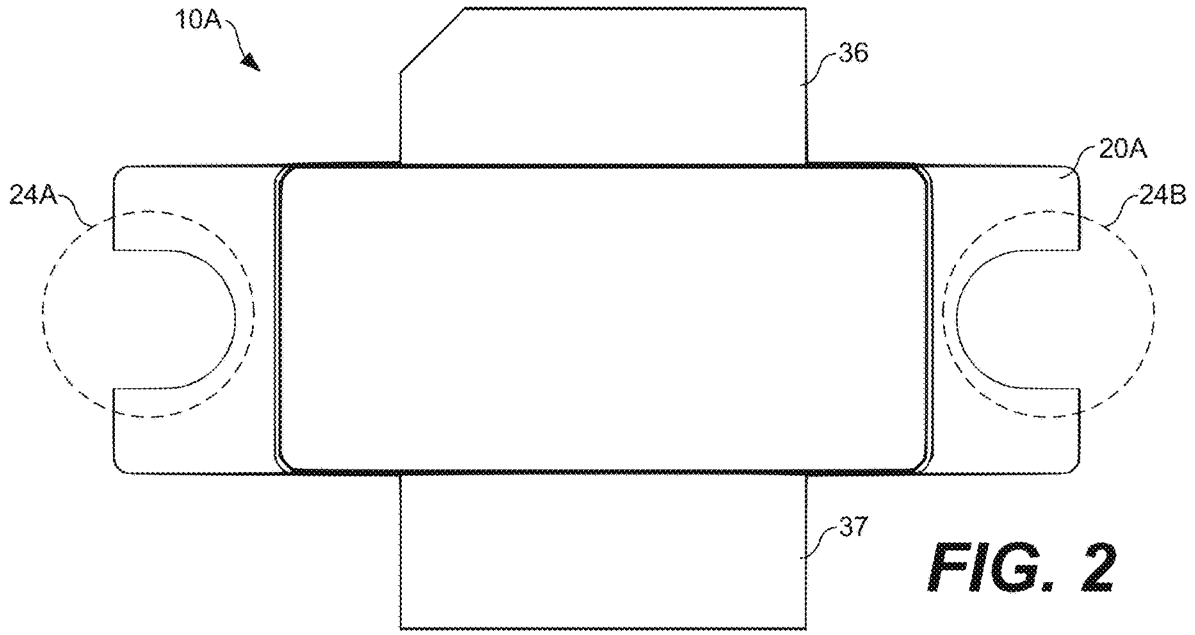
FIG. 2 illustrates a top view of another example semiconductor device package according to various embodiments described herein.

FIG. 2 illustrates a top view of another example package 10A according to various embodiments described herein. The package 10A is similar to the package 10, but the flange 20A is relatively longer than the flange 20 and includes mounting ears or eyelets 24A and 24B at the ends of the flange 20A. Mechanical fasters, such as screws, bolts, or other fastening means can be used to secure the package 10A down to a heatsink, for example, at the mounting eyelets 24A and 24B. The package 10A also includes two conductive leads 36 and 37 rather than the four conductive leads 31-34 of the package 10. Like the flange 20, the flange 20A incorporates a composite core material including diamond particles distributed in metal, examples of which are described below with reference to FIG. 5. Other packages incorporating flanges similar to the flanges 20 and 20A are also within the scope of the embodiments, and a plastic molded package including such a flange or slug is described below with reference to FIG. 7.

Figure 3:
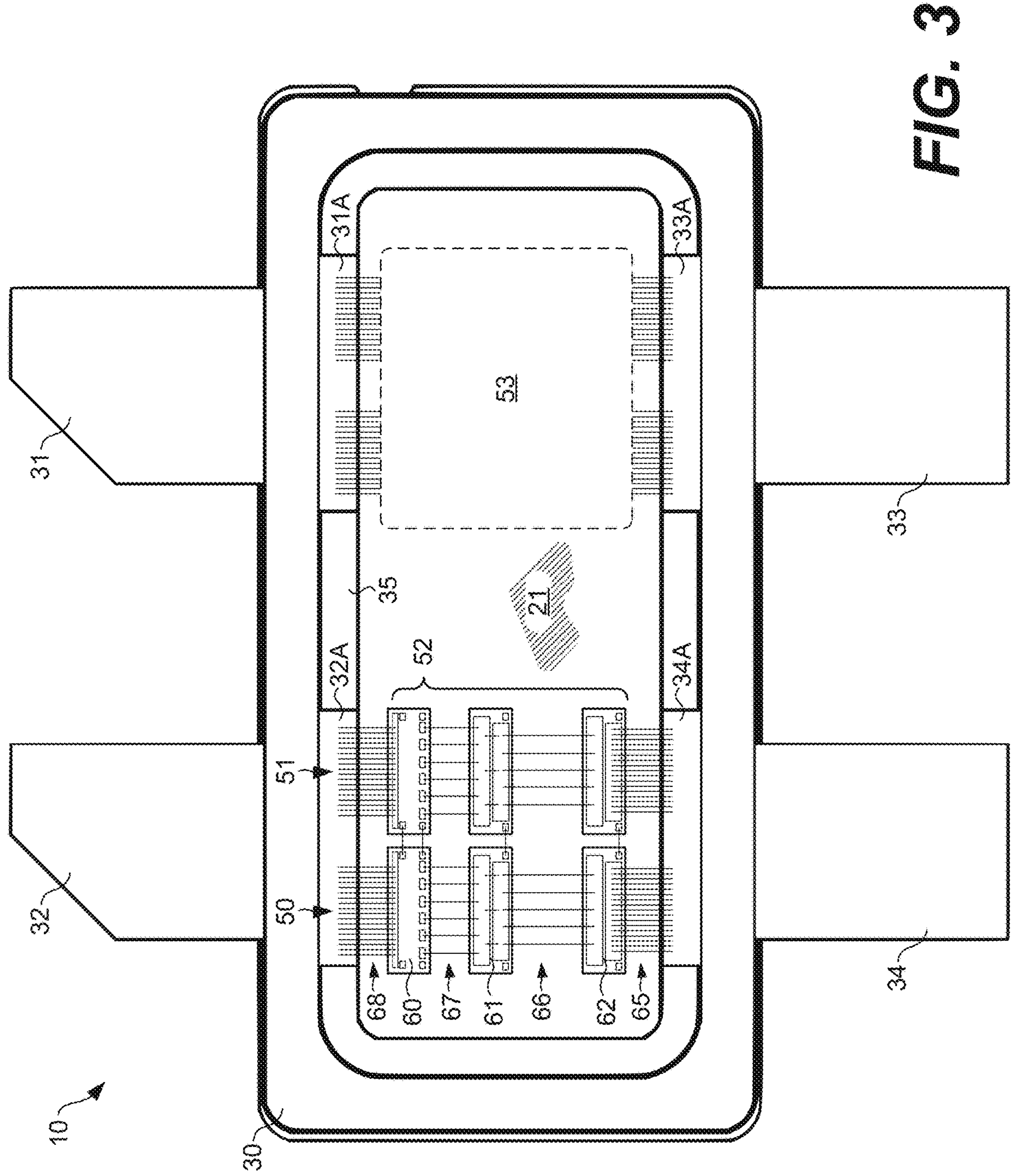
FIG. 3 illustrates the semiconductor device package shown in FIG. 1A with components attached to the flange within the package according to various embodiments described herein.

FIG. 3 illustrates the semiconductor device package 10 shown in FIG. 2 with components attached to the top surface 21 of the flange 20 within the package 10. The cover 40 is omitted from view in FIG. 3. Various types of active and passive components, such as integrated circuits formed on semiconductor substrates (formed in any semiconductor processing technology), including arrangements of transistors, resistors, capacitors, and inductors, among other components, discrete electronics components, electro-optical components, electro-mechanical components, and other components and combination thereof can be placed, arranged, and secured within the package 10. Thus, FIG. 3 illustrates an example arrangement of semiconductor devices formed on semiconductor die, and other arrangements of die can be relied upon in the package 10. The arrangement of semiconductor devices shown in FIG. 3 can also be extended to any of the other packages described herein.

In FIG. 3, columns 50 and 51 of semiconductor die are secured to the top surface 21 of the flange 20 within the frame 30, to form a group of die 52. As shown in FIG. 3, the column 50 includes the semiconductor die 60-62. The column 51 includes a similar column of semiconductor die, although they are not individually referenced in FIG. 3. Additional columns of die can be relied upon. The columns 50 and 51 are coupled in parallel with each other between the conductive lead 34 and the conductive lead 32 using wire bonds, as described below. A group of die 53 is coupled in parallel between the conductive lead 33 and the conductive lead 31. The semiconductor die 60-62, among the others in the package 10, can each be secured to the top surface 21 of the flange 20 using thermal epoxy, solder, solder preforms, sintered-silver die attach, or other suitable means. Gold-tin solder or solder preforms, for example, can be used to help mitigate the effects of thermal expansion mismatches between the flange 20 and the semiconductor die 60-62, although the materials of the flange 20 reduce this mismatch to some extent as compared to other materials, as described below.

In the example shown, the semiconductor die 60 includes a high power transistor amplifier, such as a transistor formed in GaN materials on a SiC substrate, as examples. According to the concepts described herein, the composite core materials of the flange 20 have a relatively high CT and, at the same time, a CTE that more closely matches the CTE of the SiC substrate than materials such as Cu. Thus, the flange 20 is particularly suitable for reliably dissipating heat from the transistor amplifier on the semiconductor die 60.

The semiconductor die 61 and 62 include one or more capacitors for input impedance matching. In some cases, the semiconductor die 61 and 62 can also include resistors to form resistor-capacitor networks for input impedance matching, among other circuit components. Together, the semiconductor die 61 and 62 can be relied upon for first- and second-harmonic termination, control, and input impedance matching for the transistor amplifier on the semiconductor die 60. Depending on the needs for input impedance matching, the semiconductor die 61 can be omitted, the semiconductor die 62 can be omitted, or both the semiconductor die 61 and 62 can be omitted.

After the groups of die 52 and 53 are secured to the top surface 21 of the flange 20 in the semiconductor device package 10, the die are electrically coupled to the conductive leads 31-34 of the frame 30 and to each other. Particularly, the bond wires 65 are coupled between the conductive lead 34 and bond pads on the semiconductor die 62. The bond wires 66 are coupled between bond pads on the semiconductor die 62 and bond pads on the semiconductor die 61. The bond wires 67 are coupled between bond pads on the semiconductor die 61 and bond pads on the semiconductor die 60. Additionally, the bond wires 68 are coupled between bond pads on the semiconductor die 60 and the conductive lead 32. Any suitable type and number of bond wires can be used, such as gold bond wires of suitable diameter or thickness. Additional bond wires can also be used to electrically couple the semiconductor die 60-62 in the column 50 with corresponding semiconductor die in the column 51, between stich pads on the die. In that way, the respective potentials at certain circuit nodes among the die can be matched and referenced with each other, helping to maintain stability.

The group of die 52 in the semiconductor device package 10 can operate collectively as a single three-terminal active device. Particularly, the group of die 52 can operate as a single common source transistor amplifier, with the conductive lead 34 acting as a gate input, the conductive lead 32 acting as a drain output, and the flange 20 acting as a common source. The group of die 53 can also operate collectively as another, single three-terminal active device in the semiconductor device package 10. The groups of die 52 and 53 can be used together to form a D-mode amplifier in some cases, although other amplifier configurations can be used.

In other cases, the semiconductor device package 10 can omit the group of semiconductor die 53 and conductive leads 31 and 33. In that case, the semiconductor device package 10 can appear as a single three-terminal active device having or consisting of only three terminals or package leads. In still other cases the semiconductor device package 10 can include additional columns of semiconductor die coupled together in groups. Further, the semiconductor device package 10 can include additional leads and additional groups of die, and other variations are within the scope of the embodiments.

Figure 4:
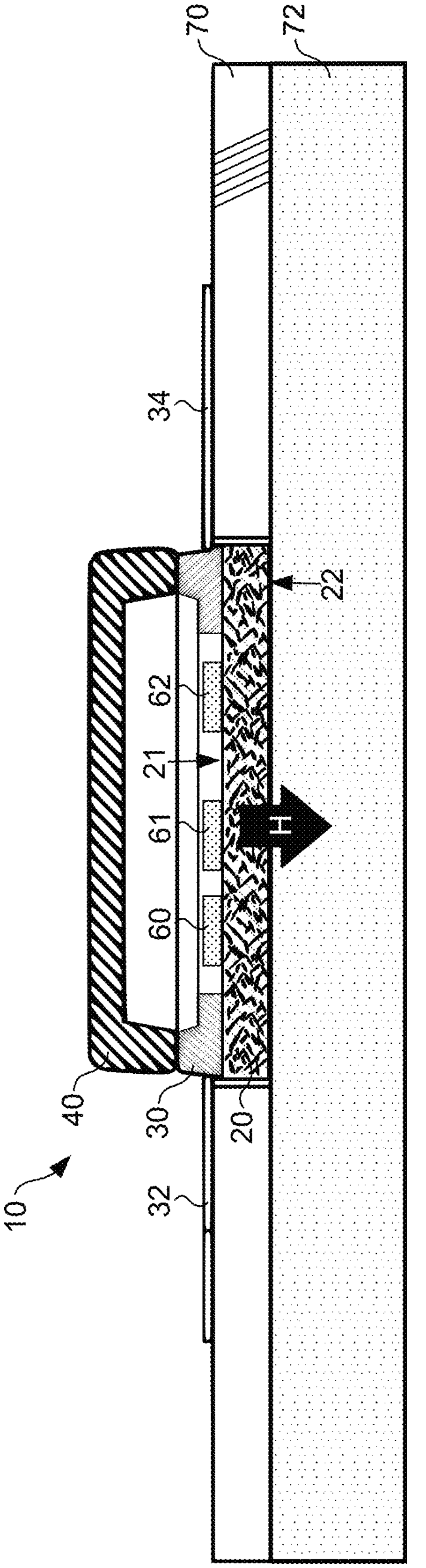
FIG. 4 illustrates the sectional view of the package designated A-A in FIG. 1A, positioned through and mounted to a printed circuit board, according to various embodiments described herein.

FIG. 4 illustrates a sectional view of the package 10 shown in FIG. 1, positioned through a printed circuit board (PCB) 70. Particularly, the PCB 70 includes a through hole or opening that is large enough for clearance of the flange 20 of the package 10, and the flange 20 is positioned within the opening in the PCB 70. The conductive leads 32 and 34 of the package 10 are electrically coupled to traces on the PCB 70, for electrical connection to other components on the PCB 70. As one example, the PCB 70 can be embodied as an RF pallet for high power amplification of RF signals, and the package 10 can provide an amplifier on the RF pallet.

A heatsink 72 is also positioned below the PCB 70, and the bottom surface 22 of the flange 20 is positioned against and contacts a top surface of the heatsink 72. The heatsink 72 can be embodied as a plate of Cu, Al, or other metal suitable for conducting heat away from the package 10. The flange 20 of the package 10 can be secured to the heatsink 72 in various ways. As examples, the flange 20 can be secured to the heatsink 72 using thermal paste, thermal epoxy, solder, or other suitable techniques. The package 10 can also be held in place with the flange 20 against the heatsink 72 using mechanical fasteners, clips, hold downs, or other means. Other packages incorporating flanges similar to the flange 20 can be secured to the heatsink 72 in other ways. The flange 20A shown in FIG. 2, for example, can be secured to the heatsink 72 using mechanical fasters, such as screws, bolts, or other fastening means at the mounting eyelets 24A and 24B, with or without the use of thermal paste between the flange 20A and the heatsink 72. The flange 20 conveys heat "H" from the semiconductor die 60-62, among others in package 10, to the heatsink 72.

Figure 5:
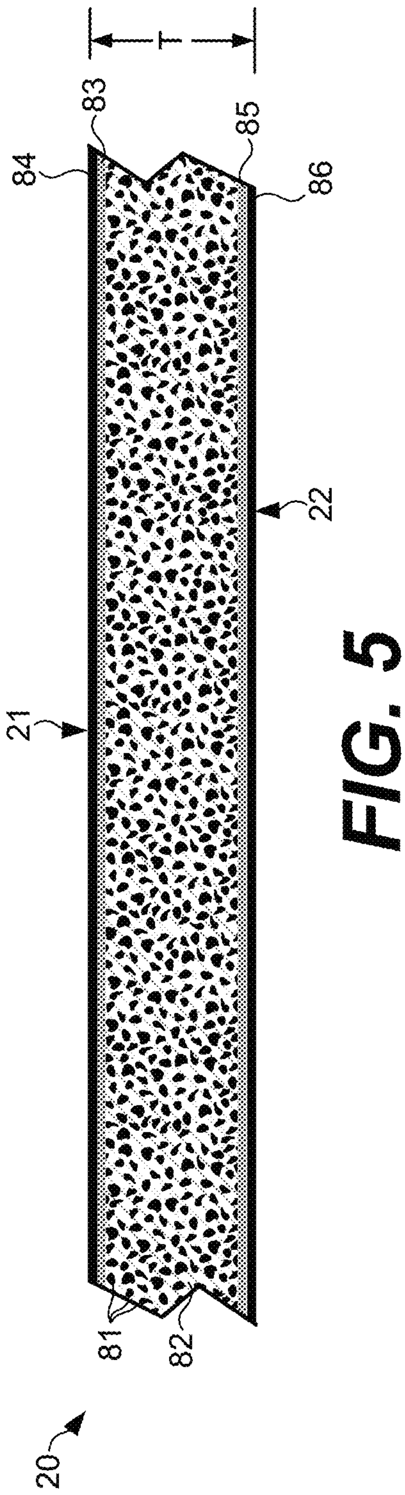
FIG. 5 illustrates a representative example of core materials in a flange according to various embodiments described herein.

FIG. 5 illustrates an example sectional view of the flange 20, to describe the core materials used in the flange 20. The flange 20 includes a core of diamond particles 81 distributed in metal 82, plating layers 83 and 84 that form the top surface 21 of the flange 20, and plating layers 85 and 86 that form the bottom surface 22 of the flange 20. The diamond particles 81 can be manufactured synthetically, in one example, although any diamonds can be used. Diamonds and diamond particles having consistent, tight carbon bonds are preferred, as such diamonds exhibit higher thermal conductivity. The size and shape of the diamond particles 81 can vary among the embodiments. For example, although relatively small diamond particles 81 are illustrated in FIG. 5, larger particles can be relied upon.

The thickness "T" of the flange 20 can range among the embodiments. Example thicknesses for the flange 20 and other flanges described herein can range from 20-80 mils (i.e., thousands of an inch) as examples, although other thicknesses can be relied upon. Larger thicknesses, including over 80 mils, over 90 mils, or thicker can also be used. The thicknesses of the plating layers 83-86 can range from between 0.05-2 mils in thickness each, and other thicknesses can be relied upon. In other aspects, the ratio of diamond particles to metal in the core of the flange 20 can range, such as from a ratio of 30% diamond to 70% metal to a ratio of 70% diamond to 30% metal. These aspects of the flange 20 can be tailored by modifying the diamond-to-metal ratio, size of the diamond particles 81, type of metal 82, thickness "T," and type and thickness of the plating metal layers 83-85, to meet the needs of certain applications. The materials can be tailored for targeted TC, CTE, flatness, or roughness, producing surfaces compatible with certain die attach materials or joining processes.

The metal 82 can be embodied as Ag, Cu, or Mo, among other metals, and Ag can be preferred for high electrical and thermal conductivity. The diamond particles 81 can be mixed and uniformly distributed into the metal 82, while the metal 82 is heated to a liquid state, and the shape of the core of the flange 20 can be established by pressing the mixture between hot plates, although other manufacturing approaches can be used.

The plating layers 83-86 can be deposited or formed over the major surfaces of the core, to help planarize the top and bottom surfaces 21 and 22. As one example, the plating layer 83 can include a layer of Nickel (Ni) deposited over a top of the core, and the plating layer 84 can include a layer of Gold (Au) deposited over the plating layer 83. Similarly, the plating layer 85 can include a layer Ni deposited over a bottom of the core, and the plating layer 86 can include a layer of Au deposited over the plating layer 84. Other metals can be used for the plating layers 83-86, however, including plating schemes using one or more layers of Ni, Au, Palladium (Pd), Cu, and other metals. The plating layers 83-86 can be formed by deposition of metal or other suitable approaches. The plating layers 83-86 can help to smooth out or planarize roughness due in part to the corners and edges of the diamonds 81 in the metal 82. A relatively large sheet of the diamond particles 81 in the metal 82 can be formed, including the plating layers 83-86, and individual flanges can be cut from the sheet. Alternatively, the diamond particles 81 and metal 82 can be formed into their final shape individually with appropriate tooling and then plating layers 83-86 can be added to all sides of the flange 20.

Due to the materials used, the flange 20 exhibits a higher TC than conventional types of materials, such as Cu, CuMo, CuMo laminates, and other materials commonly used for flanges and heat slugs in semiconductor packages. The diamond particles 81 offer very high TC, as natural diamond has a thermal conductivity of about 2200 W/m·K, whereas Cu has a TC of about 398 W/m·K and CuMo has a TC of about 220 W/m·K. Enriched monocrystalline synthetic diamond has been shown to have an even higher TC than natural diamond, and the flange 20 can incorporate synthetic diamond particles. The metal 82 provides electrical conductivity for the flange 20, and the flange 20 can be relied upon as a terminal of the package 10 as described herein.

The flange 20 also exhibits a CTE that is better for packaging certain devices than other materials. For example, Cu has a CTE of about 17.6 ppm/° C., which is mismatched as compared to many semiconductor substrates and materials, such as GaN or SiC, which can be used to manufacture high power semiconductor devices. SiC has a CTE closer to 3 or 4 ppm/° C., and it can be difficult to reliably secure SiC die to Cu flanges, particularly when cycled in temperature. Flanges formed from CuMo, CuW, and other metals have CTEs that are more closely matched to SiC substrates but exhibit lower thermal conductivities, typically less than 250 W/m·K. The CTE of the flange 20 according to the embodiments can range from 6-9 ppm/° C., which is more closely matched to that of SiC substrates, while at the same time having a TC greater than that of Cu. The flange 20 can exhibit a TC of greater than 400, 500, 600, 700, 800, 900, 1000 W/m·K, or more, offering thermal benefits, depending on the amount of diamond in the flange 20, the metals in the flange 20, and other factors described below.

Figure 6:
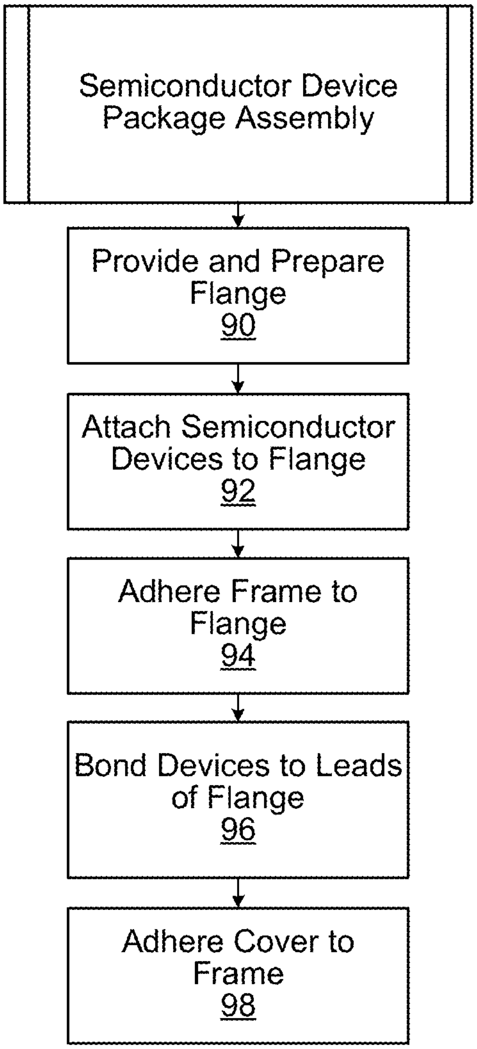
FIG. 6 illustrates an example process flow for assembly of the semiconductor device package shown in FIG. 1A according to an example embodiment described herein.

FIG. 6 illustrates an example process flow for assembly of the semiconductor device package 10 shown in FIG. 1A according to an example embodiment described herein. The steps and arrangement of the steps shown in FIG. 6 are provided as an example. In other embodiments, the order of the steps can differ from that shown. For example, an order of execution of two or more of the steps can be scrambled or altered relative to the order shown. Also, in some cases, two or more of the steps can be performed concurrently or with partial concurrence. Further, in some cases, one or more of the steps shown in FIG. 6 can be skipped or omitted. Additionally, the process is not limited to the manufacture of any particular size, shape, or style of package.

At reference numeral 90, the process includes forming or providing and, in some cases, preparing a flange incorporating the core materials described herein. For example, the flanges 20 or 20A can be sourced from a manufacturer or manufactured separately. The flanges 20 or 20A can also be modified or prepared in some cases, even if sourced from a vendor. For example, the periphery 21A of the flange 20 (see FIG. 1B) can be roughened using laser etching, mechanical abrasion (e.g., masked or unmasked sandblasting or abrasing), chemical etching, or other techniques in some cases. In other cases, the periphery 21A can be prepared by selective plating to add roughness. The preparation of the periphery 21A in this way can help to strengthen the bond between the bottom surface of the frame 30 and the periphery 21A of the flange 20, in later process steps.

At reference numeral 92, the process includes attaching one or more semiconductor die to the flange. For example, one or more semiconductor die can be secured to the top surface 21 of the flange 20 using thermal epoxy, solder, solder preforms, sintered-silver die attach, or other suitable means, as described above with reference to FIG. 3.

At reference numeral 94, the process includes attaching or adhering a frame to the flange. For example, the bottom surface of the frame 30 can be secured to the top surface 21 of the flange 20 using an adhesive, such as epoxy or another plastic adhesive, using solder, using mechanical interlocks or interferences, using fasteners, or combinations thereof. The bottom surface of the frame 30 can cover a periphery 21A of the top surface 21 of the flange 20.

At reference numeral 96, the process includes bonding the devices attached to the flange at reference numeral 92 to the conductive leads of the flange attached at reference numeral 94. Referring again to FIG. 3 as an example, semiconductor die can be electrically coupled to the conductive leads 31-34 of the frame 30, such as to the conductive portions 33A and 34A of the conductive leads 33 and 34, using wire bonds or other means.

At reference numeral 98, the process includes adhering a cover to the frame. For example, the bottom surface of the cover 40 can be secured to the top of the frame 30 using adhesives, such as epoxy or other plastic adhesives, plastic welding, heating, or melting processes, using solder, using mechanical interlocks or interferences, using fasteners, or combinations thereof.

Figure 7:
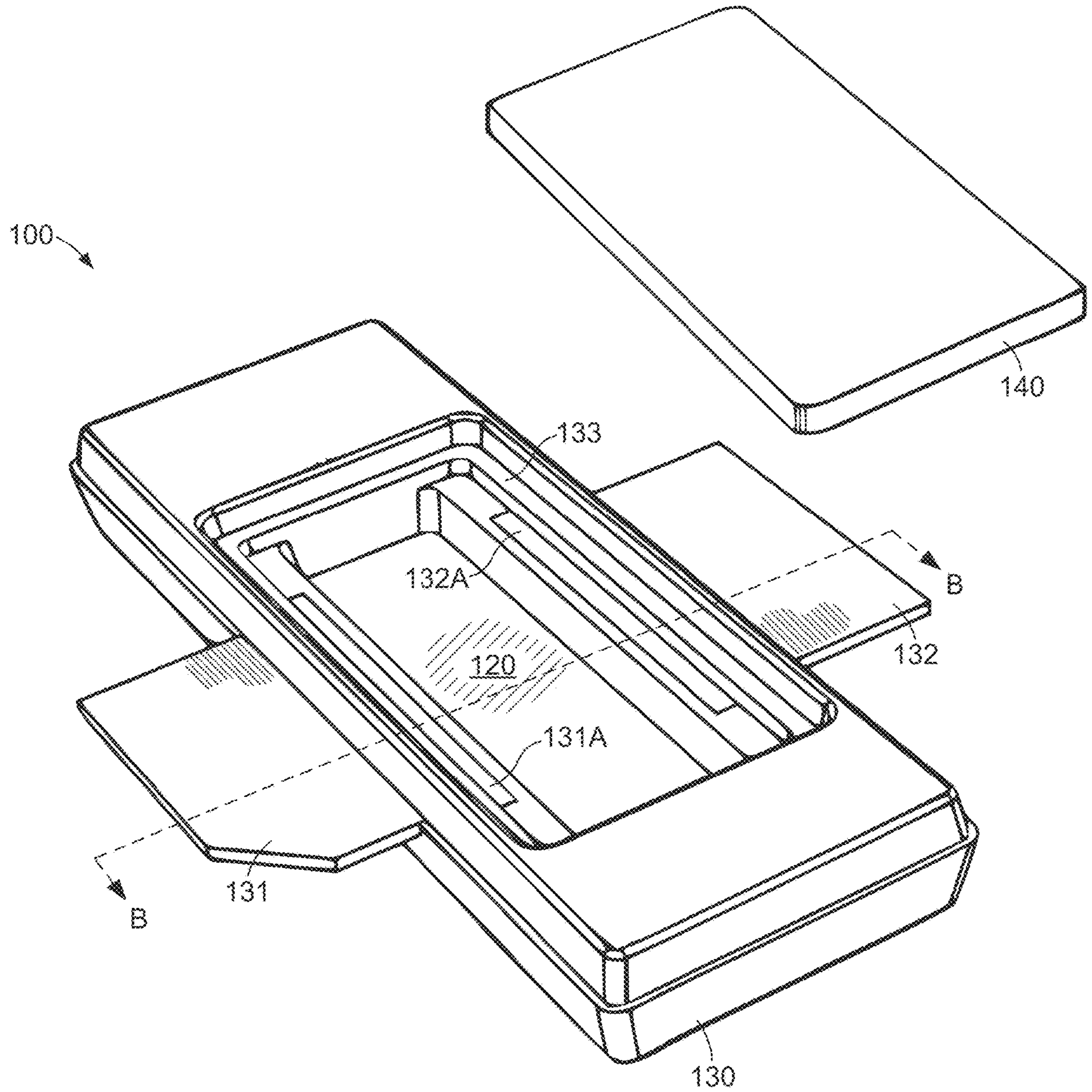
FIG. 7 illustrates a perspective view of another example semiconductor device package according to various embodiments described herein.

Turning to other examples, FIG. 7 illustrates a perspective view of another semiconductor device package 100 according to the embodiments described herein. The package 100 is illustrated as a representative example. The package 100 is not drawn to scale, and other packages consistent with the concepts described herein can vary in shape and/or size as compared to that shown. The package 100 includes a flange or slug 120, a frame 130 that is molded around the peripheral edge of the flange 120, to form an air cavity within the package 100, and a cover 140. The package 100 also includes conductive leads 131 and 132, each of which extends from outside the frame 130, through at least a portion of the frame 130, and is exposed in part within the air cavity inside the package 100. Packages similar to the package 100, but without air cavities, are also within the scope of the embodiments as described below.

The frame 130 can be formed by molding plastic or similar materials, such as polymers or polymer blends, with or without glass, carbon, or other reinforcements, among other materials. In the example shown in FIG. 7, the frame 130 is molded to provide an air cavity within the package 100, but the frame 130 can also be molded without the air cavity. In that case, the cover 140 is unnecessary and can be omitted. In other examples, the frame 130 can be formed using ceramic materials. In that case, the frame 130 can be formed from a ceramic material, and the cover 140 can be formed as a ceramic, metal, or glass lid. The cover 140 can be secured over the air cavity within the frame 130 using any suitable methods to create a hermetic (or near hermetic) seal.

The conductive leads 131 and 132 can be cut away from a larger leadframe assembly after construction of the package 100. The construction of the package 100 using a leadframe assembly is described in further detail below. The conductive leads 131 and 132 can be formed from Cu, Al, Sn, Ag, Au, Zn, other metals, or any compositions thereof, and can be plated with Ag, Au, Ni, Pd, or other metals using full plating, spot-plating or other techniques.

Similar to the package 10, a number of semiconductors devices, formed on semiconductor die, can be secured within the package 100. The semiconductor die can be secured within the package 100 either before or after the frame 130 is formed around the flange or slug 120. The semiconductor die can be secured to the top surface 121 of the flange 120 using thermal epoxy, solder, solder preforms, sintered-silver die attach, or other suitable means. Semiconductor die in the package 100 can be electrically coupled, using wire bonds or other means, to the exposed portions 131A and 132A of the conductive leads 131 and 132 within the package 100. The cover 140 can then be placed upon and secured to the raised platform 133 within the package 100, to enclose the air cavity.

Similar to the flange 20, the flange 120 includes a core of diamond particles distributed in metal, plating layers that form the top surface of the flange, and plating layers that form the bottom surface of the flange 120. The flange 120 can be formed as described above with reference to FIG. 5, to offer a high TC and low CTE.

Figure 8:
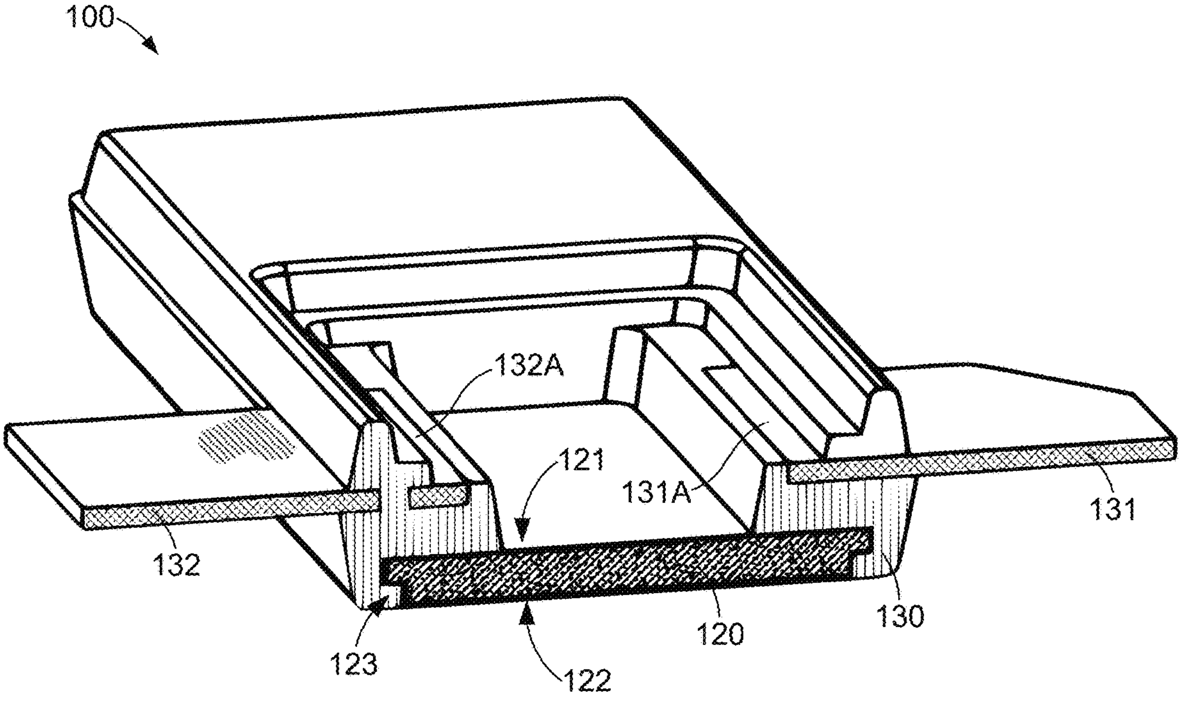
FIG. 8 illustrates the sectional view of the semiconductor device package designated B-B in FIG. 7 according to various embodiments described herein.

FIG. 8 illustrates the sectional view of the package 100 designated B-B in FIG. 7. As shown, the flange 120 includes a top surface 121, a bottom surface 122, and an interlocking edge surface 123. The interlocking edge surface 123 includes a lip, tooth, or other mechanical interference feature that extends around the outer peripheral top edge of the flange 120, as compared to its bottom peripheral edge. Because the frame 130 surrounds the lip or tooth of the interlocking edge surface 123, the flange 120 cannot be easily pulled out from the frame 130 or the bottom of the package 100. The interlocking edge surface 123 can be added to the flange 120, after the flange 120 is sourced from a manufacturer or vendor in some cases. The interlocking edge surface 123 can be formed using any suitable material removal techniques.

Figure 9:
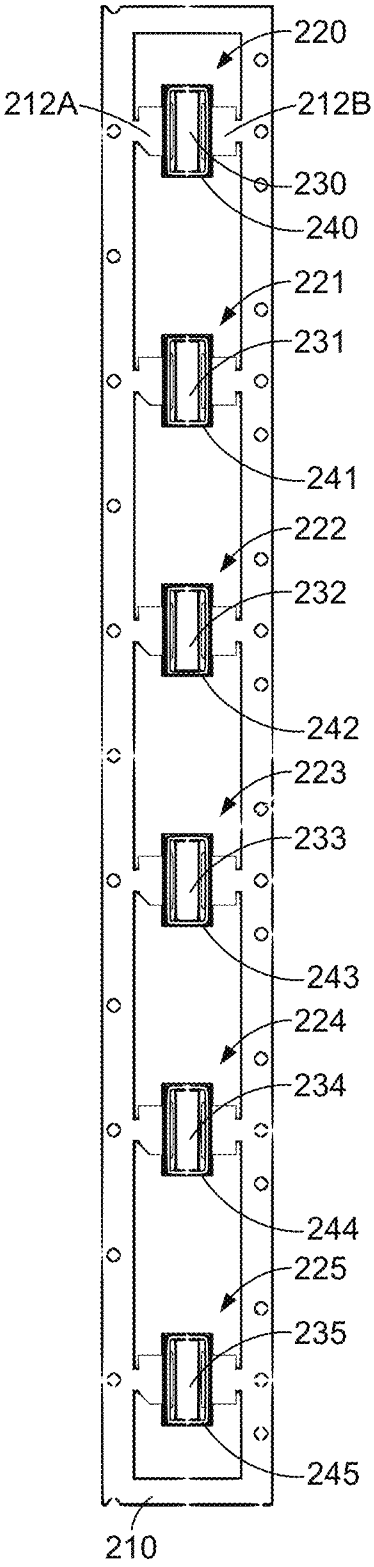
FIG. 9 illustrates an example leadframe and semiconductor device packages according to various embodiments described herein.

FIG. 9 illustrates an example leadframe 210 and air cavity packages 220-225 according to embodiments described herein. Each of the air cavity packages 220-225 is similar to the package 100 described above. The leadframe 210 can be formed (e.g., cut, sheared, pressed out, etched, etc.) from a larger strip or sheet of conductive metal or metals, such as Cu, Al, Sn, Ag, Au, Zn, other metals, compositions thereof, and can be plated with Ag, Au, Ni, Pd, or other metals. As shown in FIG. 9, the leadframe 210 includes conductive leads 212A and 212B for the package 220 and similar conductive leads (not individually referenced) for the other packages 221-225. The leadframe 210 shown in FIG. 9 is provided by way of example, and larger or smaller leadframes of different formats can be relied upon.

Use of the leadframe 210 as a starting point for the manufacture of the packages 220-225 offers benefits, including higher assembly throughputs, lower cost, higher precision, and the ability to use the existing tool sets and equipment of manufacturers and suppliers. For example, the leadframe 210 can be used to grip, hold, and move a relatively large number of packages without repositioning them individually. Further, once the leadframe 210 is formed at a suitable level of precision, the relative spacing of each of the packages 220-225, once formed, is known. Thus, electrical components can be placed and interconnected within each of the 220-225 easily by automated machines, without the need to move and reposition the air cavity packages 220-225 individually.

During manufacturing, the leadframe 210 can be arranged into the correct relative position along with the flanges 230-235. Each of the flanges 230-235 can include the composite core materials and plating layers described above with reference to FIG. 5. The leadframe 210 can be positioned with and, in some cases, secured to the flanges 230-235. A mold can be placed around the leadframe 210 and the flanges 230-235, and plastic can be injected into the mold to form the frames 240-245. In other cases, the leadframe 210 can be positioned with the flanges 230-235 in the mold, and plastic can be injected into the mold to form the frames 240-245. A number of semiconductors devices, formed on semiconductor die, can be secured to the flanges 230-235 either before or after the frames 240-245 are formed around the flanges 230-235 using the mold.

The packages 220-225 can remain attached to the leadframe 210 during subsequent assembly steps. After assembly is complete, the individual packages 220-225 can be separated from the leadframe 210 by cutting or shearing the leadframe 210 at locations to separate the conductive leads 212A and 212B (and the other conductive leads) for each of the packages 220-225.

Figure 10:
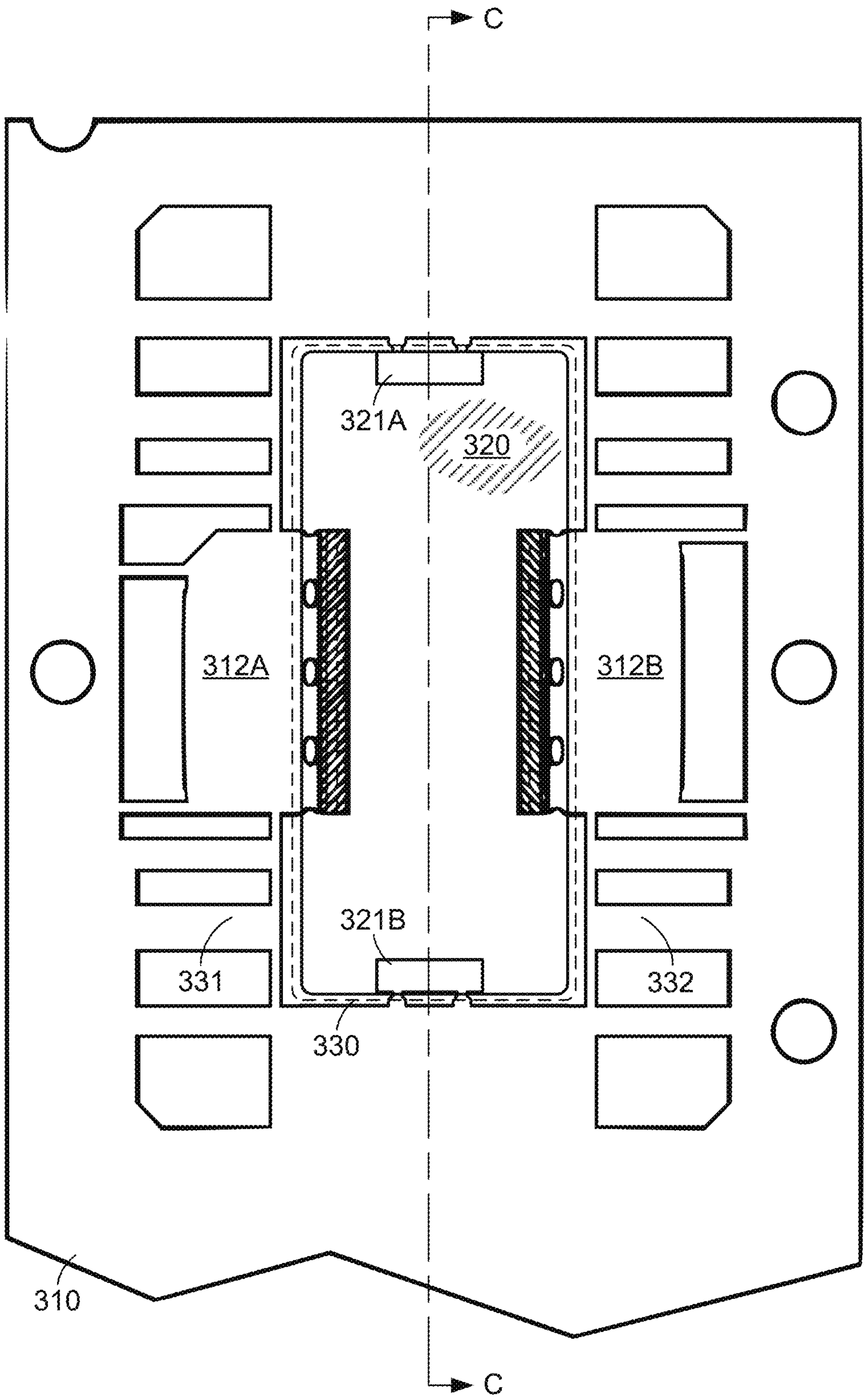
FIG. 10 illustrates a part of an example leadframe arranged with a flange or slug for constructing packages according to various embodiments described herein.

FIG. 10 illustrates a part of an example leadframe 310 arranged with a flange 320 for constructing packages. A bounding box 330 is also shown in FIG. 10. The bounding box 330 is representative of the size of the plastic frame or body of the package to be formed around the leadframe 310 and the flange 320 shown in FIG. 10. Consistent with the description above, the leadframe 310 can be formed (e.g., cut, sheared, pressed out, etched, etc.) from a larger strip or sheet of conductive metal or metals. Among other features, the leadframe 310 includes the conductive leads 312A and 312B, downset facets 321A and 321B, and leadframe structure supports 331 and 332 (among others not individually referenced in FIG. 10). Portions of the conductive leads 312A and 312B that will be exposed within the air cavity of the air cavity package are designated by hatching in FIG. 10. The leadframe 310 is provided as an example in FIG. 10, and other leadframes can be relied upon. For example, other leadframes that provide more than two conductive leads for each individual package can be used, including leadframes that provide 4, 6, 8, or more conductive leads per package.

The downset facets 321A and 321B can be used to secure the flange 320 to the leadframe 310 before a mold is placed around them for the injection of the plastic frame or body of the package. In one example case, metal rivets, pins, or bolts can be inserted through the downset facets 321A and 321B to fasten the flange 320 to the leadframe 310. Other fastening means can be used, however, including solder, brazing, adhesives, and other bonds.

Once fastened together, semiconductor die can be secured to the flange 320 and wire bonded to the conductive leads 312A and 312B as described below, before a plastic frame is molded around the flange and the die. In later process steps, a mold can be placed around the leadframe 310 and the flange 320. The mold can be shaped to form a solid plastic package around the flange 320 and the semiconductor die, and plastic can be injected into the mold to form a continuous molded plastic frame or body of the package around the flange 320 and the semiconductor die to about the size of the bounding box 330. The package thus formed can be kept attached to the leadframe 310 during the remaining assembly processes. Example process steps for leadframe package device assembly or manufacturing according to this example described in further detail below with reference to FIG. 12.

Alternatively, after the downset facets 321A and 321B are secured to the flange 320, a mold can be placed around the leadframe 310 and the flange 320. The mold can be shaped to form a plastic package around the flange 320, with an air cavity formed over the flange 320. Plastic can be injected into the mold to form a plastic frame or body of the package around the flange 230 with an air cavity formed over the flange 320. The package thus formed can be kept attached to the leadframe 310 during the remaining assembly process steps, including steps to secure semiconductor die to the flange 320 within the air cavity and to wire bond the die to the conductive leads 312A and 312B. Example process steps for leadframe package device assembly or manufacturing according to this example are described in further detail below with reference to FIG. 13.

Figure 11:
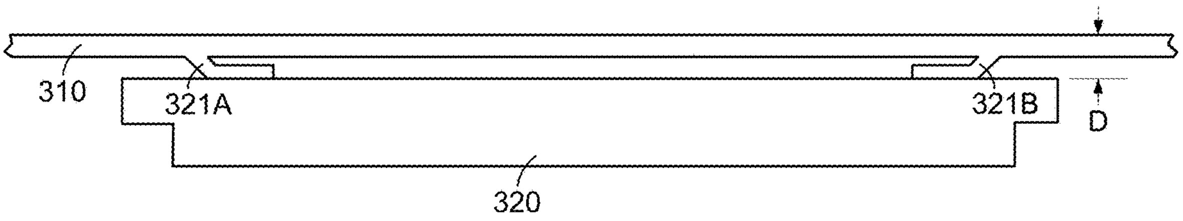
FIG. 11 illustrates the sectional view of the leadframe arranged with the flange designated C-C in FIG. 10 according to various embodiments described herein.

FIG. 11 illustrates a sectional view of the leadframe 310 arranged with the flange 320 designated C-C in FIG. 10. The downset facets 321A and 321B of the leadframe 310 are positioned on the top of the flange 320. In some cases, the downset facets 321A and 321B of the leadframe 310 can be secured to the top of the flange 320. The downset facets 321A and 321B can be secured to the flange 320 using solder, solder preforms, fasteners, or other suitable means. The fasteners can include metal rivets, pins, or bolts inserted through the downset facets 321A and 321B and into the flange 320.

In FIG. 11, the distance "D" between the top surface of the flange 320 and the top surface of the leadframe 310 can be seen. The distance "D" defines the distance between the top surface of the flange 320 and the exposed surfaces of conductive leads within the package being formed.

Figure 12:
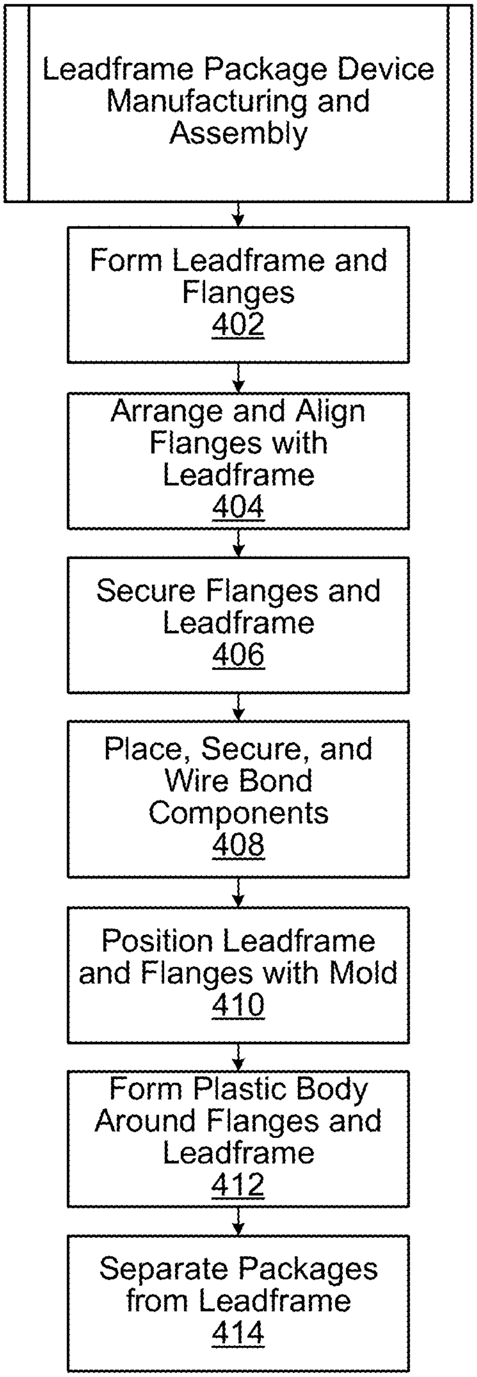
FIG. 12 illustrates an example process of leadframe semiconductor device package manufacturing and assembly according to embodiments described herein.

FIG. 12 illustrates an example process of leadframe package manufacturing and assembly according to embodiments described herein. The steps and arrangement of the steps shown in FIG. 12 are provided as an example. In other embodiments, the order of the steps can differ from that shown. For example, an order of two or more of the steps can be scrambled or altered relative to the order shown. Also, in some cases, two or more of the steps can be performed concurrently or with partial concurrence. Further, in some cases, one or more of the steps can be skipped or omitted. Additionally, the process is not limited to the manufacture of any particular size, shape, or style of package.

At reference numeral 402, the process includes forming a leadframe. For example, a leadframe similar to the leadframe 210 shown in FIG. 9 or the portion of the leadframe 310 shown in FIG. 10 can be formed (e.g., cut, sheared, pressed out, etched, etc.) from a larger strip or sheet of conductive metal. The leadframe can include any suitable number of conductive leads, downset facets, leadframe structure supports, etc.

At reference numeral 402, the process can also include forming or providing flanges incorporating the core materials described herein. Flanges or slugs similar to the flanges 120, 230-235, or 320 can be sourced from a manufacturer or manufactured separately. The flanges can include the interlocking edge surface 123, and certain surfaces of the flanges can be roughened using laser etching, mechanical abrasion, chemical etching, or other techniques. For example, the peripheries of the flanges can be roughened using laser etching, mechanical abrasion (e.g., masked or unmasked sandblasting or abrasing), chemical etching, selective plating, or other techniques in some cases. The preparation of the flanges can help to strengthen bonds and connections with other materials in later process steps as described herein.

At reference numeral 404, the process includes arranging or aligning the flanges with the leadframe. As an example of that arrangement, FIG. 10 illustrates the flange 320 arranged in position with the leadframe 310. In practice, multiple flanges can be positioned at corresponding locations along a leadframe at reference numeral 404, similar to that shown in FIG. 9.

At reference numeral 406, the process includes securing or fastening the flanges and the leadframe together. Referring to FIG. 11 for an example, the downset facets 321A and 321B of the leadframe 310 are positioned on the top of the flange 320. In some cases, the downset facets 321A and 321B of the leadframe 310 can be secured to the top of the flange 320. The downset facets 321A and 321B can be secured to the flange 320 using solder, solder preforms, brazing, fasteners, or other suitable means. The fasteners can include metal rivets, pins, or bolts inserted through the downset facets 321A and 321B and into the flange 320. In some cases, the securing at reference numeral 406 can be omitted or skipped, as it can be sufficient in some cases to align the flanges with the leadframe without securing them together. In some cases, the leadframe and packages can also be moved to other machines for picking semiconductor die and other electrical components and placing the die and components onto the flanges, as needed.

At reference numeral 408, the process includes placing the semiconductor die and other electrical components onto the flanges and securing the semiconductor die and electrical components to the flanges. Automated pick and place tooling can be used in this step. The process also includes wire bonding the die and components out to the exposed conductive leads within the air cavities of the packages. Automated wire bond machines can be used in this step. These steps can be performed or conducted as described above with reference to FIG. 3.

At reference numeral 410, the process includes positioning the leadframe and the flanges, with the semiconductor die and electrical components secured to the flanges, into a mold for forming the frame of the packages. At reference numeral 412, the process includes forming a number of plastic frames or bodies around the flanges. As one example, the bounding box 330 in FIG. 10 is representative of the size of a plastic frame or body of a package to be formed around the portion of the leadframe 310 shown. The frames of the packages can be formed through the injection of plastic into the mold, surrounding the flanges, die and components, and leadframe. The frames can be molded out of any suitable plastic or polymers, such as liquid crystal polymers (LCPs) or polymer blends, with or without glass, carbon, or other reinforcements, among other materials.

At reference numeral 414, the process includes separating the packages from the leadframe. The packages can be separated by cutting or shearing the leadframe structure supports, to separate the conductive leads of each package away from the larger leadframe assembly.

Figure 13:
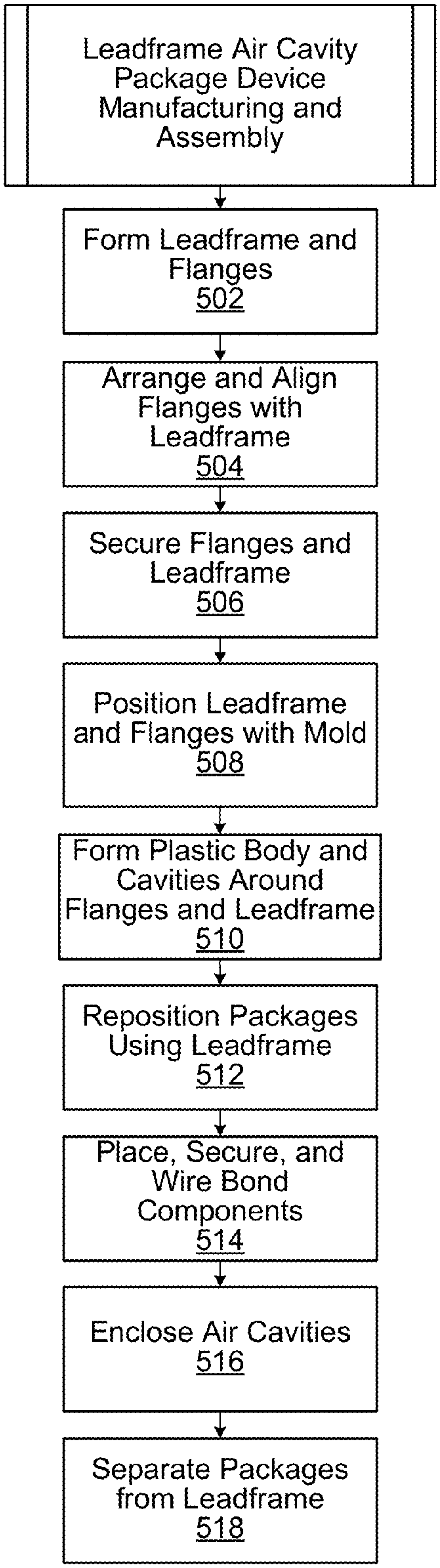
FIG. 13 illustrates another example process of leadframe semiconductor device package manufacturing and assembly according to embodiments described herein.

FIG. 13 illustrates another example process of leadframe package manufacturing and assembly according to embodiments described herein. As compared to the process described above with reference to FIG. 12, the packages formed using the process shown in FIG. 13 include air cavities, and semiconductor die and other electrical components are secured within the air cavities of the packages after plastic frames of the packages are molded. The steps and arrangement of the steps shown in FIG. 13 are provided as an example. In other embodiments, the order of the steps can differ from that shown. For example, an order of two or more of the steps can be scrambled or altered relative to the order shown. Also, in some cases, two or more of the steps can be performed concurrently or with partial concurrence. Further, in some cases, one or more of the steps can be skipped or omitted. Additionally, the process is not limited to the manufacture of any particular size, shape, or style of package.

At reference numeral 502, the process includes forming a leadframe. For example, a leadframe similar to the leadframe 210 shown in FIG. 9 or the portion of the leadframe 310 shown in FIG. 10 can be formed (e.g., cut, sheared, pressed out, etched, etc.) from a larger strip or sheet of conductive metal. The leadframe can include any suitable number of conductive leads, downset facets, leadframe structure supports, etc.

At reference numeral 502, the process can also include forming or providing and, in some cases, preparing flanges incorporating the core materials described herein. Flanges or slugs similar to the flanges 120, 230-235, or 320 can be sourced from a manufacturer or manufactured separately. The flanges can also be modified or prepared in some cases, even if sourced from a vendor. For example, the flanges can be modified to include the interlocking edge surface 123, and certain surfaces can be roughened using laser etching, mechanical abrasion, chemical etching, or other techniques. The preparation of the flanges can help to strengthen bonds and connections with other materials in later process steps.

At reference numeral 504, the process includes arranging or aligning the flanges with the leadframe. As an example of that arrangement, FIG. 10 illustrates the flange 320 arranged in position with the leadframe 310. In practice, multiple flanges can be positioned at corresponding locations along a leadframe at reference numeral 504, similar to that shown in FIG. 9.

At reference numeral 506, the process includes securing or fastening the flanges and the leadframe together. Referring to FIG. 11 for an example, the downset facets 321A and 321B of the leadframe 310 are positioned on the top of the flange 320. In some cases, the downset facets 321A and 321B of the leadframe 310 can be secured to the top of the flange 320. The downset facets 321A and 321B can be secured to the flange 320 using solder, solder preforms, brazing, fasteners, or other suitable means. The fasteners can include metal rivets, pins, or bolts inserted through the downset facets 321A and 321B and into the flange 320. In some cases, the securing at reference numeral 406 can be omitted or skipped, as it can be sufficient in some cases to align the flanges with the leadframe without securing them together.

At reference numeral 508, the process includes positioning the leadframe and the flanges into a mold for forming the frame of the packages. The mold can be shaped to provide air cavities above or over the flanges in the resulting packages. At reference numeral 510, the process includes forming a number of plastic frames or bodies, with air cavities, around the flanges. As one example, the bounding box 330 in FIG. 10 is representative of the size of a plastic frame or body of a package to be formed around the portion of the leadframe 310. When the frames or bodies are formed, air cavities are formed within the frames and above the flanges as described herein, due to the shape of the mold. The frames of the packages can be formed through the injection of plastic into the mold surrounding the flanges and leadframe. The frames can be molded out of any suitable plastic or polymers, such as liquid crystal polymers (LCPs) or polymer blends, with or without glass, carbon, or other reinforcements, among other materials.

At reference numeral 512, the process includes repositioning the packages formed at reference numeral 510 using the supporting leadframe. That is, once the air cavity packages are formed or molded around the leadframe and flanges at reference numeral 510, the surrounding leadframe can be used to move the packages without repositioning them individually. The leadframe and packages can be moved to machines for picking semiconductor die and other electrical components and placing the die and components into the air cavities and onto the flanges.

At reference numeral 514, the process includes placing one or more semiconductor die and other electrical components into the air cavities and onto the flanges, and securing the die and components to the flanges. Automated pick and place tooling can be used in this step. The process also includes wire bonding the die and components out to the exposed conductive leads within the air cavities of the packages. Automated wire bond machines can be used in this step. These steps can be performed or conducted as described above with reference to FIG. 3.

At reference numeral 516, the process includes enclosing the air cavities of the packages. For example, covers can be secured over the air cavities of the packages as described herein. At reference numeral 518, the process includes separating the packages from the leadframe. The packages can be separated by cutting or shearing the leadframe structure supports, to separate the conductive leads of each package away from the larger leadframe assembly. In other cases, packages can be removed (e.g., cut or sheared away) from their surrounding leadframes before electrical components are secured and enclosed within those packages, but the leadframe offers the ability to easily move several packages at a time.

Power transistors formed on semiconductor die can be packaged using the embodiments described herein. Among other types, the transistors described herein can be formed as high electron mobility transistors (HEMTs), pseudomorphic high-electron mobility transistors (pHEMTs), metamorphic high-electron mobility transistors (mHEMTs), laterally diffused metal oxide semiconductor transistors (LDMOS), metal-insulator-semiconductor field effect transistors (MISFETs or MISHFETs), metal-oxide-semiconductor field effect transistors (MOSFETs).

The transistors described herein can be formed using a number of different semiconductor materials and semiconductor manufacturing processes. Example semiconductor materials include the group IV elemental semiconductor materials, including Silicon (Si) and Germanium (Ge), compounds thereof, and the group III elemental semiconductor materials, including Al, Gallium (Ga), Indium (In), and compounds thereof. Semiconductor transistor amplifiers can be constructed from group III-V direct bandgap semiconductor technologies, in certain cases, as the higher bandgaps and electron mobility provided by those devices can lead to higher electron velocity and breakdown voltages, among other benefits. Thus, in some examples, the concepts can be applied to group III-V direct bandgap active semiconductor devices, such as III-Nitride material devices (Aluminum (Al)-, Gallium (Ga)-, Indium (In)-, and their alloys (AlGaIn) based Nitrides), GaAs, InP, InGaP, AlGaAs, etc. devices. However, the principles and concepts can also be applied to transistors and other active devices formed from other semiconductor materials.

As used herein, the term "III-Nitride material(s)" or "Gallium Nitride material(s)" refers to any Group III element-nitride compound. Non-limiting examples of III-nitride materials include boron nitride (BN), aluminum nitride (AlN), gallium nitride (GaN), indium nitride (InN), and thallium nitride (TIN), as well as any alloys including Group III elements and Group V elements, such as aluminum gallium nitride ($Al_x Ga_{(1-x)} N$), indium gallium nitride ($In_y Ga_{(1-y)} N$), aluminum indium gallium nitride ($Al_x In_y Ga_{(1-x-y)}N$), gallium arsenide phosphide nitride ($GaAs_a P_b N_{(1-a-b)}$), aluminum indium gallium arsenide phosphide nitride ($Al_x In_y Ga_{(1-x-y)} As_a P_b N_{(1-a-b)}$), among others. Typically, when present, arsenic and/or phosphorous are at low concentrations (e.g., less than 5 weight percent). The term "gallium nitride" or GaN semiconductor refers directly to gallium nitride, exclusive of its alloys.

According to certain embodiments, the substrates of the semiconductor devices described herein can include Silicon (Si) (i.e., a substrate containing the Si in any form). Examples of substrates comprising Si that can be used in various embodiments include, but are not limited to, SiC substrates, bulk Si wafers, Si-on-insulator (SOI) substrates, Silicon-on-sapphire (SOS) substrates, and separation by implantation of oxygen (SIMOX) substrates, among others. Suitable Silicon substrates also include composite substrates that include a Si wafer bonded to another material such as diamond, AlN, SiC, or other polycrystalline materials. Silicon substrates having different crystallographic orientations can be used, though single crystal silicon substrates can be preferred in certain, but not necessarily all, embodiments. In some embodiments, Silicon (111) substrates are used. A III-Nitride or GaN transistor can be a III-Nitride heterostructure FET (III-N HFET), a metal-insulator-semiconductor FET (MISFET or MISHFET), such as a metal-oxide-semiconductor FET (MOSFET). Alternatively, when implemented as an HFET, III-Nitride transistor can be a HEMT configured to produce a 2DEG.

The features, structures, and characteristics described above may be combined in one or more embodiments in any suitable manner, and the features discussed in the various embodiments are interchangeable in many cases. Although relative terms such as "on," "below," "upper," "lower," "top," "bottom," "right," and "left" may be used to describe the relative spatial relationships of certain structural features, these terms are used for convenience only, as a direction in the examples. When a structure or feature is described as being "over" (or formed over) another structure or feature, the structure can be positioned over the other structure, with or without other structures or features intervening between them. When two components are described as being "coupled to" each other, the components can be electrically coupled to each other, with or without other components being electrically coupled and intervening between them. When two components are described as being "directly coupled to" each other, the components can be electrically coupled to each other, without other components being electrically coupled between them.

Terms such as "a," "an," "the," and "said" are used to indicate the presence of one or more elements and components. The terms "comprise," "include," "have," "contain," and their variants are used to be open ended and may include or encompass additional elements, components, etc., in addition to the listed elements, components, etc., unless otherwise specified. The terms "first," "second," etc. are used only as labels, rather than a limitation for a number of the objects.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be interpreted to encompass modifications and equivalent structures.

Therefore, the following is claimed:

1. A packaged semiconductor device, comprising:

a flange comprising a top surface, a bottom surface, and a peripheral edge surface;

a semiconductor device die comprising Gallium Nitride materials positioned over the top surface of the flange, the semiconductor device die comprising a transistor source metal layer on a bottom of the die, the transistor source metal layer being electrically coupled to the top surface of the flange;

a ceramic frame secured to a periphery of the top surface of the flange within the peripheral edge surface of the flange, the ceramic frame forming an air cavity bounded in part by the top surface of the flange and comprising a platform level within the air cavity; and at least one conductive lead that extends from outside the ceramic frame, through at least a portion of the ceramic frame, and is exposed within the air cavity, wherein:

the flange comprises:

a composite core material, the composite core material comprising smaller synthetic diamond particles distributed in metal and larger synthetic diamond particles placed at one or more particular locations in the metal at a ratio of diamond particles to metal for a coefficient of thermal expansion of the flange from about 6-9 ppm/° C.; and a first plating metal layer over a top of the composite core material and a second plating metal layer over a bottom of the composite core material, each of the first plating metal layer and the second plating metal layer having a thickness to planarize edges of the synthetic diamond particles in the composite core material and form the top surface and the bottom surface of the flange; and a central portion of the top surface of the flange is smooth and the periphery of the top surface of the flange is roughened for adhesion with the ceramic frame; and the ceramic frame is brazed to the periphery of the top surface of the flange having the coefficient of thermal expansion from about 6-9 ppm/° C.

2. The packaged semiconductor device according to claim 1, wherein:

the first plating metal layer comprises at least one layer of Nickel, Gold, Silver, Palladium, or Copper; and the second plating metal layer comprises at least one layer of Nickel, Gold, Silver, Palladium, or Copper.

3. The packaged semiconductor device according to claim 1, wherein:

the first plating metal layer comprises Gold;

the second plating metal layer comprises Gold; and the flange further comprises a third plating metal layer of Nickel between the composite core material and the first plating metal layer of Gold and a fourth plating metal layer of Nickel between the composite core material and the second plating metal layer of Gold.

4. The packaged semiconductor device according to claim 1, wherein the metal in the composite core material comprises Silver.

5. The packaged semiconductor device according to claim 1, wherein the metal in the composite core material comprises Copper.

6. The packaged semiconductor device according to claim 1, wherein the flange has a thermal conductivity greater than 700 W/m·K.

7. The packaged semiconductor device according to claim 1, wherein the flange has a thermal conductivity greater than 1000 W/m·K.

8. The packaged semiconductor device of claim 1, further comprising a ceramic cover seated and secured upon the ceramic frame.

9. The packaged semiconductor device of claim 1, wherein the semiconductor device die comprises Gallium Nitride.

10. The packaged semiconductor device of claim 1, wherein:

the semiconductor device die comprises one die among a group of semiconductor device die that operate collectively as a single common source transistor amplifier;

a source of the single common source transistor amplifier is electrically coupled to the top surface of the flange; and the flange comprises a conductive lead for the source of the single common source transistor amplifier.

11. The packaged semiconductor device of claim 1, wherein the periphery of the top surface of the flange is roughened for adhesion with the ceramic frame by etching.

12. A semiconductor device package, comprising:

a flange comprising a composite core, a first plating metal layer over a top of the composite core, and a second plating metal layer over a bottom of the composite core, the composite core comprising smaller diamond particles distributed in metal and larger diamond particles placed at one or more particular locations in the metal at a ratio of diamond particles to metal for a coefficient of thermal expansion of the flange from about 6-9 ppm/° C., each of the first plating metal layer and the second plating metal layer having a thickness to planarize edges of the diamond particles in the composite core and form a top surface and a bottom surface of the flange;

a ceramic frame brazed to a periphery of the top surface of the flange having the coefficient of thermal expansion from about 6-9 ppm/° C.; and at least one conductive lead that extends outside the ceramic frame, wherein:

a central portion of the top surface of the flange is smooth and the periphery of the top surface of the flange is roughened for adhesion with the ceramic frame.

13. The semiconductor device package according to claim 12, wherein the composite core of the flange consists of smaller synthetic diamond particles distributed in Silver and larger synthetic diamond particles placed at one or more particular locations in the Silver.

14. The semiconductor device package according to claim 12, wherein:

the first plating metal layer comprises Gold;

the second plating metal layer comprises Gold; and the flange further comprises a third plating metal layer of Nickel between the composite core material and the first plating metal layer of Gold and a fourth plating metal layer of Nickel between the composite core material and the second plating metal layer of Gold.

15. The semiconductor device package according to claim 12, wherein the flange has a thermal conductivity greater than 700 W/m·K.

16. The semiconductor device package according to claim 12, wherein the diamond particles comprise monocrystalline synthetic diamond particles.

17. A semiconductor device package, comprising:

a flange comprising:

a composite core material of smaller diamond particles distributed in metal and larger diamond particles placed at one or more particular locations in the metal at a ratio of diamond particles to metal tailored for a targeted thermal conductivity and a targeted coefficient of thermal expansion; and a first plating metal layer over a top of the composite core material and a second plating metal layer over a bottom of the composite core material, each of the first plating metal layer and the second plating metal layer having a thickness to planarize edges of the diamond particles in the composite core material and form a top surface and a bottom surface of the flange;

a ceramic frame secured to the flange, the flange having a coefficient of thermal expansion from about 6-9 ppm/° C. based on the ratio, by brazing; and at least one conductive lead comprising Gold plating that extends at least in part through the ceramic frame, wherein the flange has a thermal conductivity greater than 700 W/m·K based on the ratio.

18. The semiconductor device package according to claim 17, wherein the composite core material of the flange consists of smaller monocrystalline synthetic diamond particles distributed in Silver and larger monocrystalline synthetic diamond particles placed at one or more particular locations in the Silver.

19. The semiconductor device package according to claim 17, wherein:

the first plating metal layer comprises Gold;

the second plating metal layer comprises Gold; and the flange further comprises a third plating metal layer of Nickel over the first plating metal layer of Gold and a fourth plating metal layer of Nickel over the second plating metal layer of Gold.

20. A packaged semiconductor device, comprising:

a flange comprising a composite core, a first plating metal layer over a top of the composite core, and a second plating metal layer over a bottom of the composite core, the composite core comprising diamond particles in metal, each of the first plating metal layer and the second plating metal layer having a thickness to form a planar top surface and a planar bottom surface of the flange;

a group of semiconductor device die that operate collectively as a single common source transistor amplifier positioned over the planar top surface of the flange, a source of the single common source transistor amplifier being electrically coupled to the planar top surface of the flange;

a ceramic frame brazed to the flange, the flange having a coefficient of thermal expansion from about 6-9 ppm/° C., for adhesion of the ceramic frame to the flange; and at least one conductive lead comprising Gold plating, wherein:

the composite core comprises smaller diamond particles distributed in Silver and larger diamond particles placed at one or more particular locations in the Silver at a ratio of diamond particles to Silver for a coefficient of thermal expansion of the flange from about 6-9 ppm/° C. and for a thermal conductivity of the flange greater than 700 W/m·K.

21. The packaged semiconductor device according to claim 20, wherein a central portion of a top surface of the flange is smooth and a periphery of the top surface of the flange is selectively plated for roughness.

22. The packaged semiconductor device according to claim 20, wherein the ceramic frame is further secured to a top surface of the flange using at least one mechanical interlock, interference, or fastener.

* * * * *